United States Patent
Bowers et al.

(10) Patent No.: US 6,237,682 B1
(45) Date of Patent: May 29, 2001

(54) COOLING MODULE INCLUDING A PRESSURE RELIEF MECHANISM

(75) Inventors: Morris B. Bowers, Grayslake; Kevin J. McDunn, Lake In The Hills, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/303,013

(22) Filed: Apr. 30, 1999

(51) Int. Cl.⁷ .................................................. G05D 15/00
(52) U.S. Cl. ............... 165/281; 165/104.33; 165/104.27; 165/104.32; 165/917
(58) Field of Search .................. 165/104.27, 104.33, 165/104.21, 104.32, 917, 281

(56) References Cited

U.S. PATENT DOCUMENTS

| | | | |
|---|---|---|---|
| 1,630,069 | * | 5/1927 | Muir .................................. 225/917 X |
| 3,306,350 | * | 2/1967 | Beurtleret ........................ 165/104.27 |
| 3,876,027 | * | 4/1975 | Crise ............................ 165/104.27 X |
| 5,197,440 | * | 3/1993 | Georgs et al. ................... 165/104.32 |
| 5,379,830 | * | 1/1995 | Itoh ................................. 165/104.27 |
| 5,582,242 | * | 12/1996 | Hamburger et al. ........ 165/104.33 X |
| 6,062,299 | * | 5/2000 | Choo et al. ................. 165/104.27 X |

FOREIGN PATENT DOCUMENTS

0010463 * 1/1979 (JP) ................................ 165/104.27

* cited by examiner

Primary Examiner—Christopher Atkinson
(74) Attorney, Agent, or Firm—John B. Mac Intyre; Lalita P. Williams

(57) ABSTRACT

The present invention provides a cooling module (100) and a method for forming the cooling module (100). The cooling module (100) is effective in reducing the temperature of heat-generating components mounted on the cooling module (100). The cooling module (100) includes a housing (105), a pressure relief mechanism (200), and a shearing surface (201). The housing (105) includes a cooling material (121) disposed therein. The pressure relief mechanism (200) is disposed within the housing (105) and covers the opening (203) to provide a seal that seals the housing (105). The shearing surface (201) is effective to break the seal upon exceeding a predetermined pressure within the housing (105).

2 Claims, 3 Drawing Sheets

100

COOLING MODULE INCLUDING A PRESSURE RELIEF MECHANISM

FIELD OF THE INVENTION

The invention relates generally to cooling for electronic devices, and more particularly to a cooling module and a method for forming a cooling module.

BACKGROUND OF THE INVENTION

Electronic devices such as power amplifiers, power supplies, multi-chip modules, electronic hybrid assemblies such as power amplifiers, microprocessors and passive components such as filters may contain heat sources which require cooling during normal operation. Various techniques may be used for cooling electronic devices. Traditionally, electronic devices have been cooled by natural or forced air convection which involves moving air past conduction heat sinks attached directly or indirectly to the devices.

Efforts to reduce the size of devices have focused upon increased integration of electronic components. Sophisticated thermal management techniques using liquids, which allow further abatement of device sizes, have often been employed to dissipate the heat generated by integrated electronics.

Two-phase thermosyphons have been developed to provide cooling for electronic devices. Two-phase thermosyphons typically include a cooling liquid, often a two-phase material, within a housing. The two-phase material, typically a liquid, vaporizes when sufficient heat density is applied to the liquid in the evaporator section. The vapor generated in the evaporator section moves away from the liquid towards the condenser section. In the condenser section, the vapor transforms back to liquid by rejecting heat to the ambient atmosphere. This phase-change cycle is used to spread the heat dissipated by discrete devices over a larger area, resulting in lower device temperatures compared to conventional heat sinks.

In a two-phase thermosyphon, the operating temperature of the unit is dictated by a balance between the heat input to the system and the heat rejected. Based upon the resulting temperature, the thermosyphon has a corresponding internal pressure which is dictated by the fluid properties.

A lightweight, compact design of two-phase thermosyphon typically includes a thin-shell housing with an porous structural material core that is vacuum brazed together to yield a unit with high seal integrity. At normal operating temperatures, the two-phase fluid yields a corresponding pressure that is near or below ambient conditions. Thus the unit is very structurally sound. However, in the event of extreme increases in the temperature, such as during a fire, the internal pressure will exceed the unit's structural limits causing it to burst or structurally fail in a highly unpredictable manner.

There is therefore a need for incorporating a device for pressure relief at a predetermined pressure which maintains the seal integrity of the thermosyphon for normal operation and does not increase the unit's compact size.

DETAILED DESCRIPTION OF A PREFERRED EMBODIMENT

The present invention provides a cooling module, a method for forming the cooling module, and a method for relieving pressure within a cooling module. The cooling module includes a pressure relief mechanism that forms a seal within the cooling module. This seal is broken when a predetermined pressure within the cooling module is exceeded. The seal is broken by shearing the pressure relief mechanism along a shearing surface.

Figure 1:
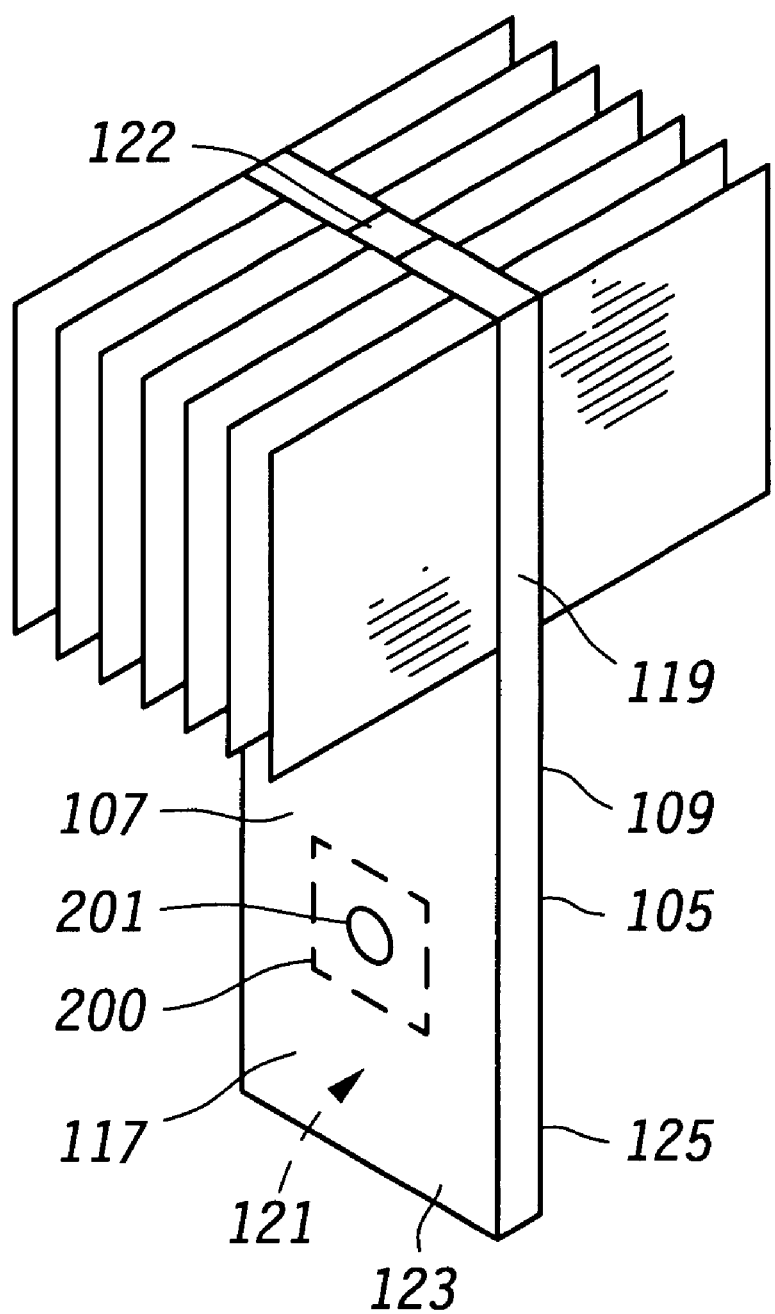
FIG. 1 depicts a two-phase thermosyphon including a pressure relief mechanism in accordance with a preferred embodiment of the present invention.

The present invention can be better understood with reference to FIGS. 1–5. FIG. 1 depicts a cooling module 100 including a pressure relief mechanism 200 in accordance with a preferred embodiment of the present invention. Cooling module 100 includes a porous structural material, not shown for clarity. Cooling module 100 comprises a sealed housing 105 that includes a first outer surface 107, a second outer surface 109 opposite first outer surface 107, a first inner surface, and a second inner surface. Cooling module 100 also includes a porous structural material disposed within housing 105. In the preferred embodiment, housing 105 includes an evaporator portion 117 and a condenser portion 119.

The present invention also preferably provides a cooling material 121 disposed within housing 105, which is substantially within evaporator portion 117. Cooling material 121 is preferably a two-phase material. Housing 105 is preferably formed of aluminum or an aluminum alloy, but can alternately be formed of any material that can be attached to form a sealed housing. Such materials include, but are not limited to, a magnesium alloy, a zinc alloy, copper or a copper alloy, or stainless steel.

Porous structural material preferably includes a plurality of lanced offset fins. Porous structural material is preferably formed of a metal foam.

Cooling module 100 also includes a shearing surface 201 that is effective in providing a shearing edge for shearing pressure relief mechanism 200 upon exceeding a predetermined pressure within cooling module 100.

Cooling module 100 is preferably formed utilizing the following method. First housing piece 123 and second housing piece 125 are formed. Housing pieces 123 and 125 are preferably formed from separate pieces of sheet metal, preferably aluminum. A brazable alloy is then deposited on housing pieces 123 and 125 at each of the interfaces in housing pieces 123 and 125 that are to be joined. The brazable alloy is preferably an aluminum alloy that includes magnesium and has a lower melting temperature than the aluminum that housing pieces 123 and 125 are formed of.

Housing pieces 123 and 125 are then placed together such that the brazable alloy on each of the pieces mates. Pressure is then applied, and housing pieces 123 and 125 are placed into a vacuum brazed furnace and heated to a temperature greater than the melting point of the brazable alloy but less than the melting temperature of the metal of which housing pieces 123 and 125 are formed from. Housing piece 123 and housing piece 125 are thereby joined in such a manner that the interface joining them provides a seal that is near-hermetic. As used herein, the term near-hermetic refers to a seal that is an order of magnitude less than a hermetic seal, preferably about $1 \times 10^{-7}$ standard atmospheres cc's/second air equivalent leak rate.

The porous structural material is formed, preferably of an aluminum alloy. Such a porous structural material is available from Robinson Fin Machines, Inc., of Kenton, Ohio. Porous structural material is preferably placed between first housing piece 123 and second housing piece 125 prior to attaching them.

First housing piece 123 can be attached to second housing piece 125 by any suitable method that reliably attaches the pieces and forms a hermetic seal. In the preferred embodiment of the present invention, first housing piece 123 is attached to second housing piece 125 by brazing first housing piece 123 to second housing piece 125, as described above. In an alternate embodiment, first housing piece 123 is attached to second housing piece 125 by laser welding, TIG welding, ultrasonic welding, or soldering the first housing piece to the second housing piece. In a further alternate embodiment, first housing piece 123 is attached to the second housing piece 125 by adhesively bonding the first housing piece to the second housing piece.

Cooling material 121 is preferably dispensed into housing 105 after attaching first housing piece 123 to second housing piece 125. Cooling material 121 is preferably dispensed into substantially sealed housing 105 via a fill tube 122. After filling with cooling material 121, fill tube 122 is closed and sealed, by welding or the like, to form a near-hermetically sealed housing.

Cooling material 121 is a dielectric liquid, preferably a perfluorinated carbon liquid. The preferred cooling material 121 is sold under the tradename "FLUORINERT" by 3M, Inc. Alternately, cooling material 121 can be water, alcohol, or any suitable liquid that is capable of transitioning between two phases within the operating parameters of two-phase thermosyphon 100.

The present invention works in the following manner. Two-phase thermosyphon 100 is operably coupled to one or more heat-generating components, such as power amplifiers, power supplies, multi-chip modules, electronic hybrid assemblies such as power amplifiers, microprocessors and passive components such as filters may contain heat sources which require cooling during normal operation. The two-phase thermosyphon 100 is preferably aligned in a vertical orientation, such that two-phase material 121 is located in evaporator portion 117 of two-phase thermosyphon 100.

Figure 2:
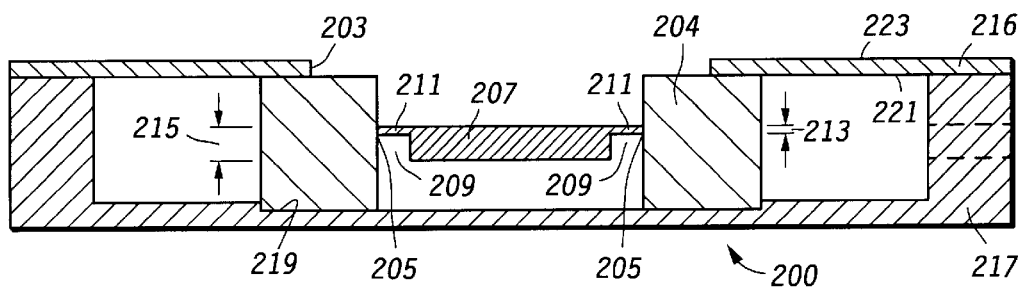
FIG. 2 depicts a cross-sectional view of the pressure relief mechanism in accordance with the preferred embodiment of the present invention.
Figure 3:
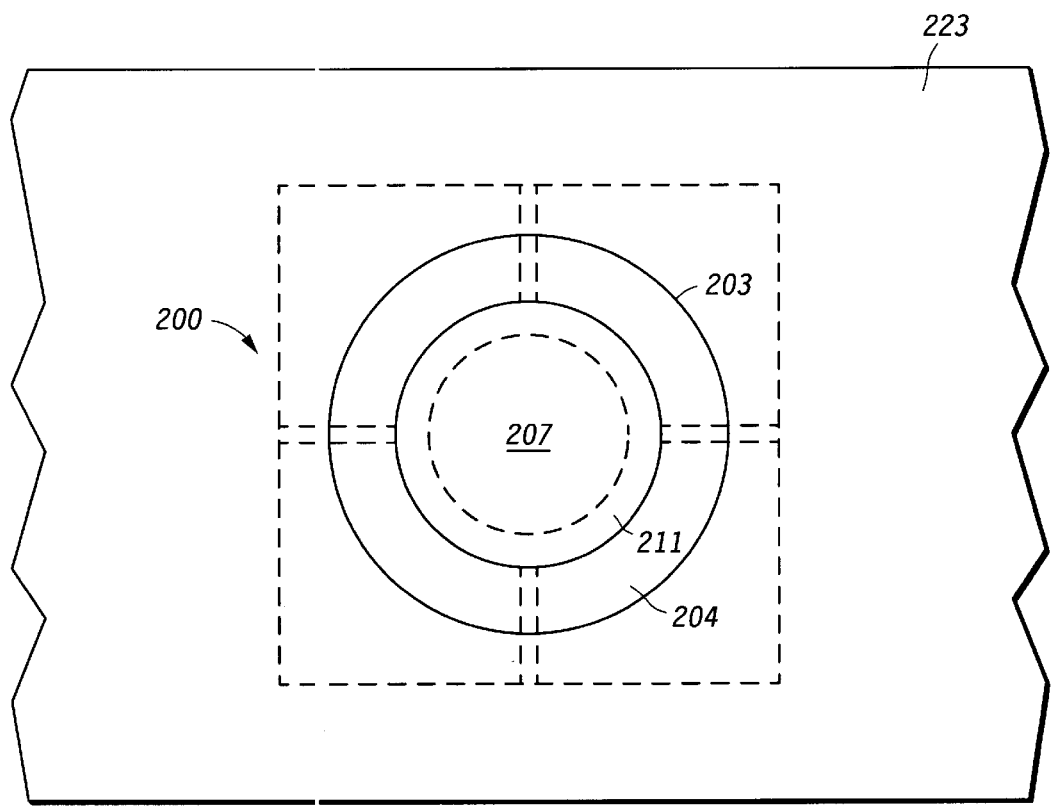
FIG. 3 depicts a top view of the pressure relief mechanism depicted in FIG. 2.

FIGS. 2 and 3 depict views of pressure relief mechanism 200 in accordance with the preferred embodiment of the present invention. Pressure relief mechanism 200 is preferably disposed within housing 105. Pressure relief mechanism 200 preferably covers opening 203 to provide a near-hermetic seal that seals housing 105. In the preferred embodiment, opening 203 has a diameter of about 35 millimeters. In an alternate embodiment, Opening 203 has a diameter of about 41 millimeters. In the preferred embodiment of the present invention, the seal formed is near-hermetic. Pressure relief mechanism 200 includes a shearing surface 205 that is effective to break the seal upon exceeding a predetermined pressure within housing 105. In the preferred embodiment, the preferred pressure at which the seal is broken is between about 170 and 190 pounds per square inch (absolute).

In accordance with the preferred embodiment of the present invention, housing 105 is formed of a first alloy and pressure relief mechanism 200 is formed of a second alloy distinct from the first alloy. In the preferred embodiment, housing 105 is formed of 6061 aluminum, and pressure relief mechanism 200 is preferably formed of 3003 aluminum.

In the preferred embodiment as depicted in FIGS. 2 and 3, pressure relief mechanism 200 is formed of a boss 204 disposed within housing 105. Boss 204 includes a generally circular central portion 207 and a trench 209 formed about central portion 207. In the preferred embodiment, central portion 207 has a diameter of about 19 millimeters. In the alternate embodiment, central portion 207 has a diameter of about 25 millimeters. Boss 204 preferably includes a trench portion 211 defined by trench 209. Trench 209 is preferably formed by machining with a cutter. Trench portion 211 has a first thickness 213 and the circular portion 207 has a second thickness 215 preferably greater than first thickness 213. In the preferred embodiment, the second thickness is about 1 millimeter. First thickness is preferably between about 0.1 and 0.15 millimeters.

Cooling module 100 includes a first surface 216 and a second surface 217 that is located opposite first surface 216. Second surface 217 preferably a depression 219 that is sized and shaped to received the boss. In the preferred embodiment, the boss and depression 219 have a width of approximately 50 millimeters.

Cooling module 100 is preferably formed in the manner described above. Housing 105 is formed and includes first surface 216. First surface 216 includes an inner face 221 and an outer face 223. A cooling material, preferably a two-phase material, is disposed into housing 105.

Cooling material 121 is preferably dispensed into housing 105 after attaching first housing piece 123 to second housing piece 125. Cooling material 121 is preferably dispensed into substantially sealed housing 105 via a fill tube. After filling with cooling material 121, the fill tube is closed and sealed, by welding or the like, to form a near-hermetically sealed housing.

Cooling material 121 is a dielectric liquid, preferably a perfluorinated carbon liquid. The preferred cooling material 121 is sold under the tradename "FLUORINERT" by 3M, Inc. Alternately, cooling material 121 can be water, alcohol, or any suitable liquid that is capable of transitioning between two phases within the operating parameters of cooling module 100.

Opening 203 is formed in first surface 216 of housing 105. Opening 203 preferably extends from inner face 221 to outer face 223 and includes shearing surface 205. Housing 105 is then sealed with pressure relief mechanism 200. Pressure relief mechanism 200 covers opening 203 to provide a seal that seals housing 105. Pressure relief mechanism 200 preferably includes shearing surface 205 that is effective to break the seal upon exceeding a predetermined pressure within housing 105. In the preferred embodiment, shearing surface 205 is formed within boss 204. In an alternate embodiment of the present invention, shearing surface 205 is formed in housing 105, as shown in FIGS. 4 and 5.

Figure 4:
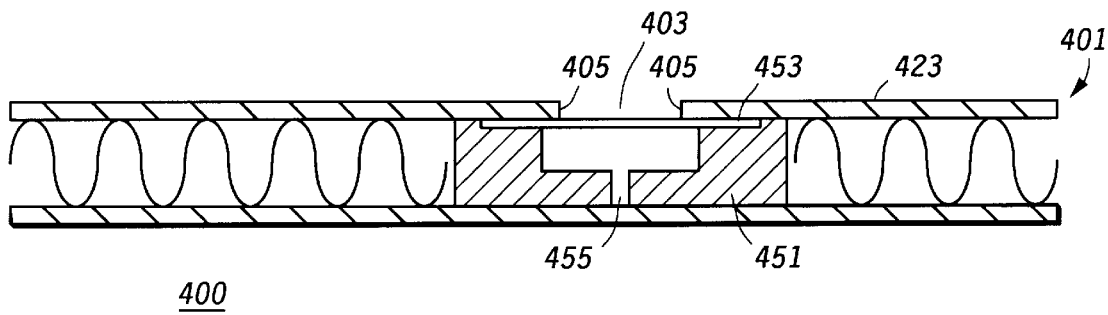
FIG. 4 depicts a cross-sectional view of the pressure relief mechanism in accordance with an alternate embodiment of the present invention.
Figure 5:
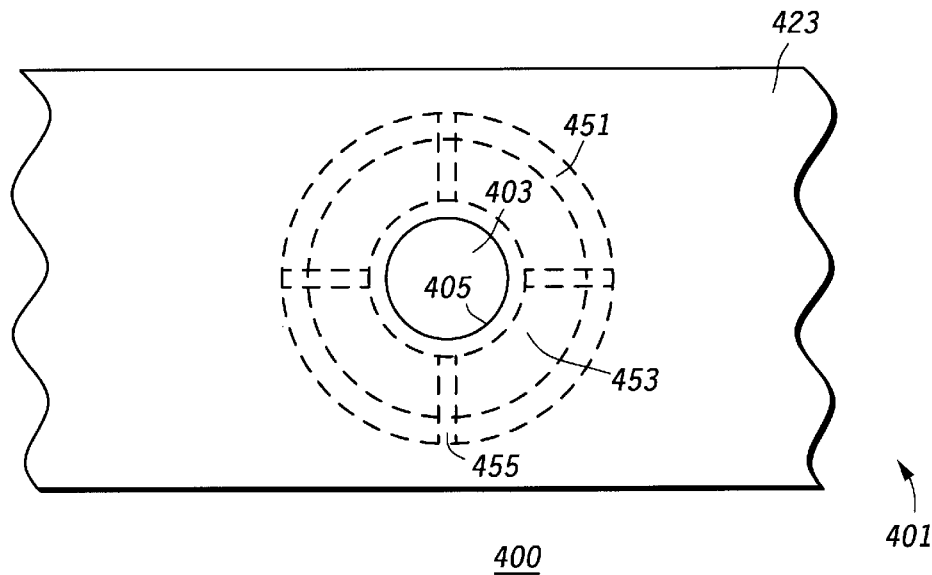
FIG. 5 depicts a top view of the pressure relief mechanism depicted in FIG. 4.

FIGS. 4 and 5 depict views of a pressure relief mechanism 400 in accordance with an alternate embodiment of the present invention. Pressure relief mechanism 400 is similar to pressure relief mechanism 200, but is formed of a two-piece assembly that includes a boss 451 and a pressure relief patch 453. In accordance with the alternate embodiment, shearing surface 405 is integral with outer surface 423. Housing 401 is preferably sealed such that shearing surface 405 is integral with outer surface 423. Outer surface 423 is preferably generally planar.

Pressure relief mechanism 400 includes boss 451 disposed proximal to opening 403. Opening 403 preferably has a diameter of about 25 millimeters. Pressure relief patch 453 is interposed between boss 451 and first surface 423 about opening 403. Pressure relief patch 453 is preferably formed of 3003 Aluminum and has a thickness of about 0.1 to about 0.15 millimeters. Boss 451 preferably includes a channel 455 to permit flow of cooling fluid 421 through boss 451 within housing 401.

Outer surface 423 preferably has a first thickness, and pressure relief patch 453 has a second thickness that is preferably less than the first thickness. When the pressure within pressure relief mechanism 400 exceeds a predetermined pressure, the seal within housing 401 is broken via a shearing force that shears pressure relief patch 453 at shearing surface 405.

Pressure is relieved within cooling module 100 via the following procedure. Pressure relief mechanism 200 covers opening 203 and forms a seal within housing 105. This seal, which is preferably near-hermetic, is broken when a predetermined pressure exists within cooling module 100. In accordance with the preferred embodiment of the present invention, the predetermined pressure is about 190 psig. In an alternate embodiment, the predetermined pressure is 170 psig. Such pressures are typically reached during an emergency condition that is not part of normal day-to-day operation of cooling module 100. Such emergency conditions occur, for instance, when the cooling module is exposed to a firs or other disaster that greatly exceeds the normal operating temperature of cooling module 100 and the device that is coupled to cooling module 100.

The step of breaking the seal comprises shearing pressure relief mechanism 200 at shearing surface 205. In accordance with the preferred embodiment as depicted in FIGS. 2 and 3, the seal is broken when pressure relief mechanism 200 is sheared at shearing surface 205 formed within pressure relief mechanism 200. In the alternate embodiment depicted in FIGS. 4 and 5, the seal is broken at shearing surface 405 formed within opening 403.

The present invention therefore provides a cooling module, a method for forming the cooling module, and a method for relieving pressure within a cooling module. The cooling module in accordance with the present invention includes a pressure relief mechanism that is disposed within the housing of a cooling module. The pressure relief mechanism preferably seals the housing by covering an opening formed in the housing. The pressure relief mechanism includes a shearing surface that is effective to shear the pressure relief mechanism when a predetermined pressure is exceeded within the housing. In this manner, the pressure relief mechanism breaks the seal and prevents the cooling module from exploding or the like.

While this invention has been described in terms of certain examples thereof, it is not intended that it be limited to the above description, but rather only to the extent set forth in the claims that follow.

We claim:

1. A cooling module for reducing the temperature of heat-generating components, the cooling module comprising:

a housing having a cooling material disposed therein, the housing including a first surface including an inner face, an outer face, and an opening extending from the inner face to the outer face and a second surface opposite the first surface;

a pressure relief mechanism disposed within the housing and covering the opening to provide a seal that seals the housing, the pressure relief mechanism formed of a boss disposed within the housing, the boss including a generally circular central portion and a trench formed about the generally circular central portion;

wherein the second surface includes a depression sized and shaped to receive the boss; and a shearing surface that is effective to break the seal upon exceeding a predetermined pressure within the housing.

2. A cooling module in accordance with claim 1, wherein the boss includes a trench portion defined by the trench, and wherein the trench portion has a first thickness, and wherein the generally circular portion has a second thickness greater than the first thickness.

* * * * *